(12) United States Patent
Jensen et al.

(10) Patent No.: US 7,863,720 B2
(45) Date of Patent: Jan. 4, 2011

(54) METHOD AND SYSTEM FOR STACKING INTEGRATED CIRCUITS

(75) Inventors: Ronald J. Jensen, Bloomington, MN (US); Richard K. Spielberger, Hanover, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/852,378

(22) Filed: May 24, 2004

(65) Prior Publication Data

US 2005/0258528 A1 Nov. 24, 2005

(51) Int. Cl.
*H01L 23/02* (2006.01)

(52) U.S. Cl. .................. 257/686; 257/692; 257/698; 257/777; 257/E25.013; 438/109

(58) Field of Classification Search ............... 257/690, 257/686, 777, E25.013, 692, 698; 438/109
See application file for complete search history.

(56) References Cited

U.S. PATENT DOCUMENTS

| | | | |
|---|---|---|---|
| 5,229,960 A | 7/1993 | De Givry | 365/63 |
| 6,469,370 B1* | 10/2002 | Kawahara et al. | 257/678 |
| 6,472,741 B1 | 10/2002 | Chen | 257/712 |
| 6,511,901 B1 | 1/2003 | Lam | 438/612 |
| 6,555,917 B1* | 4/2003 | Heo | 257/777 |
| 6,611,434 B1 | 8/2003 | Lo | 361/760 |
| 6,621,169 B2 | 9/2003 | Kikuma | 257/780 |
| 6,759,307 B1* | 7/2004 | Yang | 257/777 |
| 6,900,528 B2* | 5/2005 | Mess et al. | 257/686 |
| 2001/0000013 A1* | 3/2001 | Lin | 257/777 |
| 2001/0003375 A1* | 6/2001 | Kovats et al. | 257/685 |
| 2002/0180025 A1 | 12/2002 | Miyata et al. | 257/690 |
| 2003/0089998 A1* | 5/2003 | Chan et al. | 257/777 |
| 2004/0021230 A1* | 2/2004 | Tsai et al. | 257/777 |
| 2005/0173807 A1* | 8/2005 | Zhu et al. | 257/777 |

FOREIGN PATENT DOCUMENTS

| | | |
|---|---|---|
| EP | 0782191 | 2/1997 |
| JP | H11-177020 | 7/1999 |
| JP | H11-354563 | 12/1999 |
| JP | 2000-101016 | 4/2000 |
| JP | 2001-29182 | 10/2001 |

(Continued)

OTHER PUBLICATIONS

International Search Report dated Nov. 16, 2005.

(Continued)

*Primary Examiner*—Wael M Fahmy
*Assistant Examiner*—John C Ingham
(74) *Attorney, Agent, or Firm*—Shumaker & Sieffert, P.A.

(57) ABSTRACT

A method and system for stacking integrated circuits is described. An integrated circuit stack is formed by stacking integrated circuit pairs. The integrated circuit pairs are formed by connecting an active surface of a first integrated circuit to an active surface of a second integrated circuit using flip chip bonding. The first integrated circuit pair is connected to a substrate using an adhesive. The other integrated circuit pairs are stacked sequentially on the first integrated circuit pair using an adhesive. Wire bonding is used to connect the second integrated circuit in each of the integrated circuit pairs to the substrate.

17 Claims, 5 Drawing Sheets

FOREIGN PATENT DOCUMENTS

JP        2003133509        9/2003

OTHER PUBLICATIONS

Written Opinion of the International Searching Authority dated Nov. 16, 2005.

European Examination Report, from corresponding EP Application No. 05 754 295, mailed Dec. 16, 2009, 3 pages.

Office Action from related JP Application No. 2007-515236, mailed Jul. 20, 2010, including a translation into English, 7 pages.

* cited by examiner

METHOD AND SYSTEM FOR STACKING INTEGRATED CIRCUITS

FIELD OF THE INVENTION

The present invention relates generally to stacking integrated circuits, and more particularly, relates to stacking integrated circuits using flip chip and wire bonding technologies.

BACKGROUND

Three-dimensional integrated circuits are employed in applications in which space is a critical design factor. As the demand for more functionality in less space increases, so does the demand for three-dimensional packaging. In addition to the benefit of reducing space, these designs may also realize higher speeds because interconnects between circuit components may be shorter.

When integrated circuits are stacked, there needs to be a way to supply power, ground, and input/output (I/O) signals to each integrated circuit in the stack. Further, there needs to be a way to connect each integrated circuit in the stack to the next level of interconnection (e.g., to the next integrated circuit or to a printed circuit board). Additionally, there needs to be a way to dissipate heat generated by the stacked integrated circuits.

A method for stacking integrated circuits of the same size is important in some applications. For example, stacking memory chips to form a memory module is commonly performed to increase data storage capacity in an electronic device. Accordingly, there needs to be a way of stacking integrated circuits having the same size.

SUMMARY

A method and system for stacking integrated circuits is provided. The integrated circuits may be stacked in pairs, with a first integrated circuit pair being stacked on a substrate. An integrated circuit pair consists of a first integrated circuit and a second integrated circuit. The first and second integrated circuits may be rectangular and substantially the same size.

A metal redistribution layer may be located on an active surface of both the first and second integrated circuits. The metal redistribution layers may provide interconnections within the first and second integrated circuits, and between the first and second integrated circuits. The interconnections may connect wire bond pads to the appropriate interior solderable chip pads. As a result of the interconnections, the signals needed on the first integrated circuit may be supplied through the wire bond pads on the second integrated circuit when the first and second integrated circuits are connected together.

The active surface of the first integrated circuit is attached to the active surface of the second integrated circuit using flip chip bonding techniques. In one embodiment, the first integrated circuit is rotated 90 degrees with respect to the second integrated circuit prior to flip chip bonding. In another embodiment, the wire bond pads are removed from the first integrated circuit prior to flip chip bonding. In either of these embodiments, the wire bond pads on the second integrated circuit are easily accessible for wire bonding.

The first integrated circuit pair is attached to the substrate using an adhesive. The adhesive is located between an inactive surface of the second integrated circuit and the substrate. The next integrated circuit pair is stacked on the first integrated circuit pair using the adhesive. The adhesive is located between an inactive surface of the first integrated circuit in the first pair and an inactive surface of the second integrated circuit in the next pair. This stacking may continue for many integrated circuit pairs.

Bonding wires may connect the second integrated circuit in each of the stacked integrated circuit pairs with the substrate using wire bonding techniques. As a result, a 3-D package is formed providing a convenient method for supplying power, ground, and I/O signals to each integrated circuit in the stack. Additionally, the 3-D package may be formed using integrated circuits having approximately the same size. Further, the 3-D package may provide a method of dissipating heat without having to add a heat spreader or other device to dissipate the heat generated in the stacked integrated circuits.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

I. Forming an Integrated Circuit Pair According to a First Embodiment

Figure 1A:
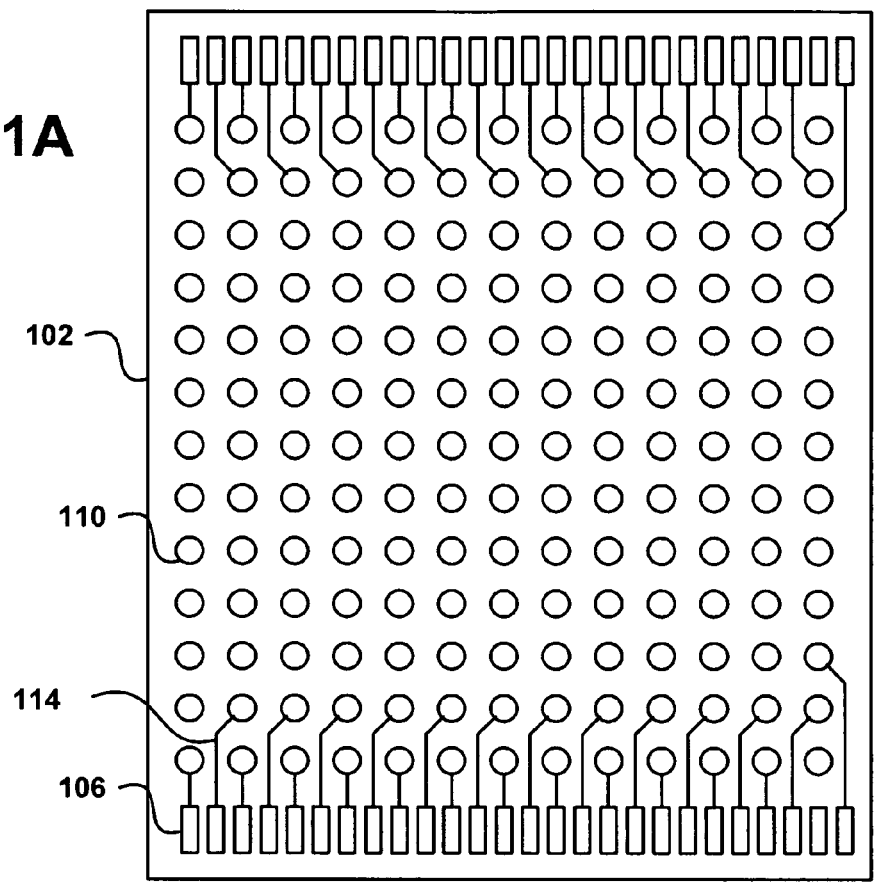
FIG. 1 is a top view of a first and second integrated circuit, according to a first embodiment.
Figure 1B:
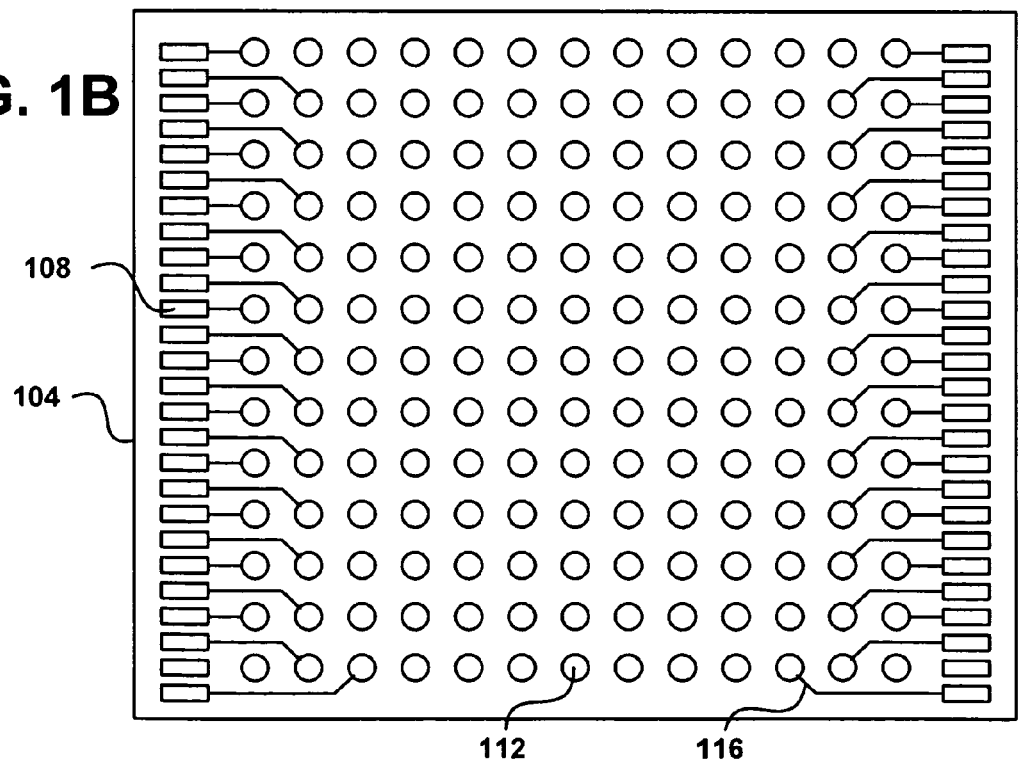

FIG. 1A depicts a top view of a first integrated circuit 102 and FIG. 1B depicts a top view of a second integrated circuit 104. The first and second integrated circuits 102, 104 may have a front surface and a back surface. The front surface may be an "active" surface in which electrical connections may be made. The back surface may be an "inactive" surface in which connections might not be made. FIG. 1A and FIG. 1B depict the active surfaces of the integrated circuits 102, 104.

The first and second integrated circuits 102, 104 may be rectangular in shape. Preferably, the first and second integrated circuits 102, 104 are approximately the same size. However, the first and second integrated circuits 102, 104 may vary in size. As depicted in FIG. 1, the first integrated circuit 102 is rotated 90-degrees with respect to the second integrated circuit 104.

In a preferred embodiment, the first and second integrated circuits 102, 104 may be thinned to a thickness of approximately 200-380 microns prior to sawing them into individual, die. However, the first and second integrated circuits 102, 104 may be thinned more than preferred embodiment. For example, the first and second integrated circuits 102, 104 may be thinned to 100 microns. Alternatively, the first and second integrated circuits 102, 104 might not be thinned. When not thinned, the first and second integrated circuits 102, 104 may have a thickness of 725 microns for an eight inch wafer or a thickness of 675 microns for a six inch wafer. However, other wafer thicknesses may be used.

The first and second integrated circuits 102, 104 have a plurality of wire bond pads 106, 108 on the periphery of two opposing sides of the active surface. The wire bond pads 106, 108 may be used to provide connectivity when using wire bonding technology. Wire bonding technology includes any method of making an electrical connection between a chip and a package, including the use of wires and ribbons. While twenty-six wire bond pads 106, 108 are shown on each of the two opposing sides of the integrated circuits 102, 104, more or less than twenty-six wire bond pads 106, 108 may be used. As further described with reference to FIG. 7, the wire bond pads 108 on the second integrated circuit 104 may be used for wire bonding.

The first and second integrated circuits 102, 104 also have a plurality of solderable chip pads 110, 112 located in the interior of the integrated circuits 102, 104. The solderable chip pads 110, 112 may be used to provide connectivity when using flip chip technology. Flip chip technology encompasses a wide variety of techniques of attaching an active surface of a chip, including the use of solder bumps, gold bumps, adhesive bumps, and plastic nickel spheres. While FIG. 1 depicts one hundred and sixty-nine solderable chip pads 110, 112 in the interiors of the first and second integrated circuits 102, 104, more or less than one hundred and sixty-nine solderable chip pads 110, 112 may be used. However in a preferred embodiment, the first and second integrated circuits 102, 104 each have the same number of solderable chip pads 110, 112.

The solderable chip pads 110 in the interior of the first integrated circuit 102 may contain under bump metallization with solder bumps. A metal redistribution layer 114 may be deposited on the active surface of the first integrated circuit 102 to provide an interconnect layer. An example metal redistribution layer 114 is shown in FIG. 1A. However, it is understood that a variety of redistribution layer designs may be used. An automatic router is typically used to design the redistribution layer 114.

The metal redistribution layer 114 may connect various solderable chip pads 110 to metal pads on the first integrated circuit 102 so that power, ground, and I/O signals are supplied to required locations on the first integrated circuit 102 (e.g., power is supplied to the power bus on the first integrated circuit 102, ground is supplied to the ground bus on the first integrated circuit 102, and I/O is supplied to I/O circuits on the first integrated circuit 102). Further, the metal redistribution layer 114 may connect the solderable chip pads 110 on the first integrated circuit 102 to the wire bond pads 108 on the second integrated circuit 104 via the solderable chip pads 112 and a metal redistribution layer 116 on the second integrated circuit 104.

The solderable chip pads 112 in the interior of the second integrated circuit 104 may contain under bump metallization. The second integrated circuit 104 may be designed so that power, ground, and I/O are supplied through wire bond pads 108 on the perimeter of the second integrated circuit 104. Additionally or alternatively, the second integrated circuit 104 may be designed so that power, ground, and I/O for the first integrated circuit 102 are supplied to the solderable chip pads 112 in the interior of the second integrated circuit 104 that are connected to the wire bond pads 108 using the metal redistribution layer 116.

As described above, a metal redistribution layer may be located on the active surface of both the first and second integrated circuits 102, 104. The metal redistribution layers 114, 116 may provide interconnections within the first and second integrated circuits 102, 104 and between the first and second integrated circuits 102, 104. The interconnections may connect the wire bond pads 108 to appropriate interior solderable chip pads 110, 112. As a result of the interconnections, the signals needed on the first integrated circuit 102 may be supplied through the wire bond pads 108 on the second integrated circuit 104 when the first and second integrated circuits 102, 104 are connected together.

Typically, the first and second integrated circuits 102, 104 have different redistribution patterns. However, the first and second integrated circuits 102, 104 may have similar redistribution patterns. The process for patterning solderable pads, solder bumps, and metal redistribution layers on integrated circuits is well known in the integrated circuit industry, and is typically done to prepare integrated circuits for flip chip bonding.

Figure 2:
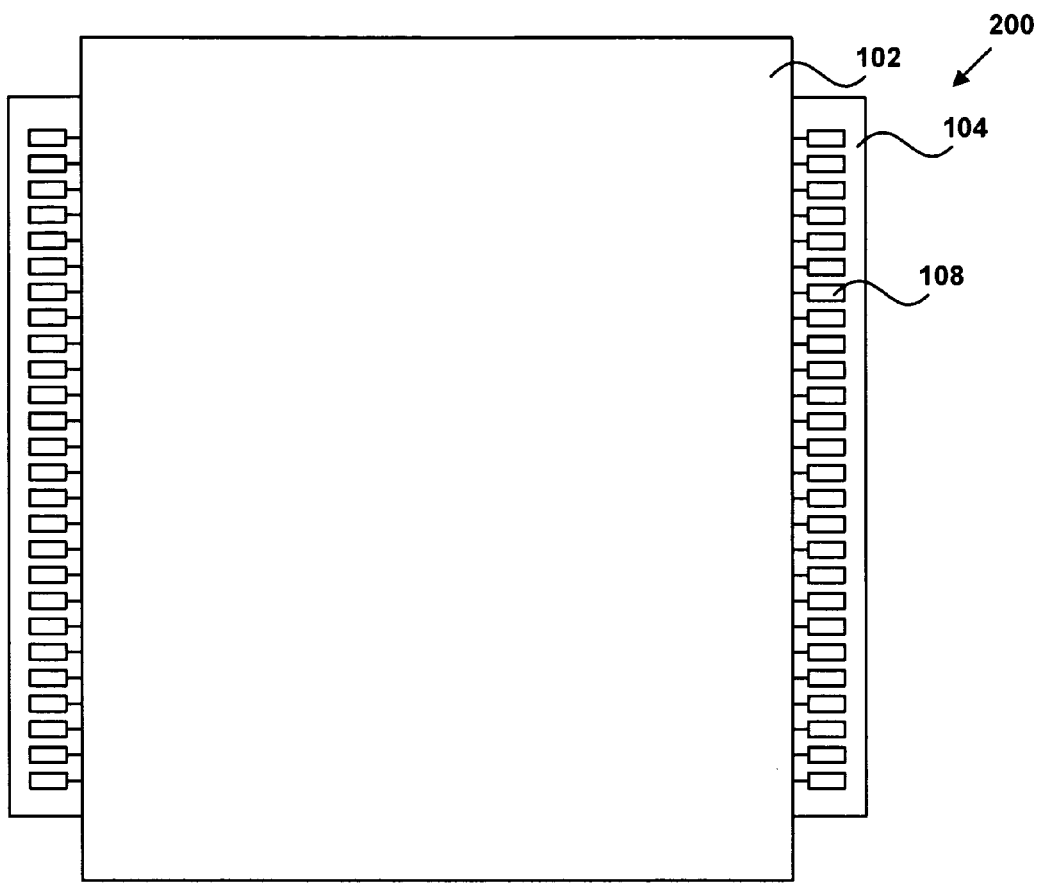
FIG. 2 is a top view of an integrated circuit pair formed by the first and second integrated circuits depicted in FIG. 1, according to an embodiment.

FIG. 2 depicts a top view of an integrated circuit pair 200 formed by the first and second integrated circuits 102, 104 depicted in FIG. 1. To assemble the integrated circuit pair 200, the first integrated circuit 102 is rotated 90 degrees (this rotation was already depicted in FIG. 1A) and flipped in relation to the second integrated circuit 102. By flipping the first integrated circuit 102, the active surface of the first integrated circuit 102 may be facing the active surface of the second integrated circuit 104.

The first and second integrated circuits 102, 104 in the integrated circuit pair 200 are then connected face-to-face via the solder bumps on the first integrated circuit 102 and the under bump metallization on the second integrated circuit 104. Because the first integrated circuit 102 is flipped, the inactive surface of the first integrated circuit 102 is shown in FIG. 2. While an underfill may be used between the two integrated circuits 102, 104, the underfill may not be necessary if the two integrated circuits 102, 104 have substantially equal thermal expansion coefficients and the underfill is not required for environmental protection.

As seen in FIG. 2, because the first and second integrated circuits 102, 104 are rectangular in shape and approximately the same size, the wire bond pads 106, 108 on one integrated circuit extends past the edge of the other integrated circuit. As the first integrated circuit 102 was flipped, only the wire bond pads 108 on the second integrated circuit 104 can be seen from the top view provided in FIG. 2. As a result, the wire bond pads 108 on the second integrated circuit 104 may be easily accessible for wire bonding.

Figure 3:
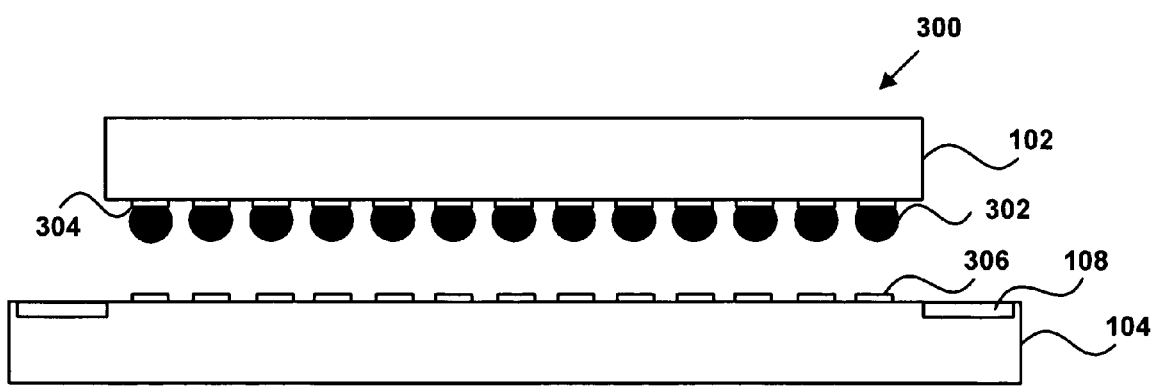
FIG. 3 is a side view of the integrated circuit pair depicted in FIG. 2, according to an embodiment.

FIG. 3 depicts a side view 300 of the integrated circuit pair 200 depicted in FIG. 2 prior to connection. The side view 300 depicts the first integrated circuit 102 flipped and positioned over the second integrated circuit 104. Solder bumps 302 may be located on under bump metallization 304 located on the first integrated circuit 102. The solder bumps 302 extend from the first integrated circuit 102 towards the under bump metallization 306 located on the second integrated circuit 104. When the flip chip bonding is completed, the solder bumps 302 may connect to the under bump metallization 306 on the second integrated circuit 104.

The side view 300 also depicts the wire bond pads 108 on the second integrated circuit 104 extending past the edge of the first integrated circuit 102. As a result, the wire bond pads 108 on the second integrated circuit 104 may be easily accessible for wire bonding purposes.

Once the integrated circuit pair 200 is formed, the integrated circuit pair 200 may be stacked with other integrated circuit pairs. Once stacked, wire bonding may be performed. Details regarding forming an integrated circuit stack are provided with reference to FIG. 7.

II. Forming an Integrated Circuit Pair According to a Second Embodiment

Figure 4A:
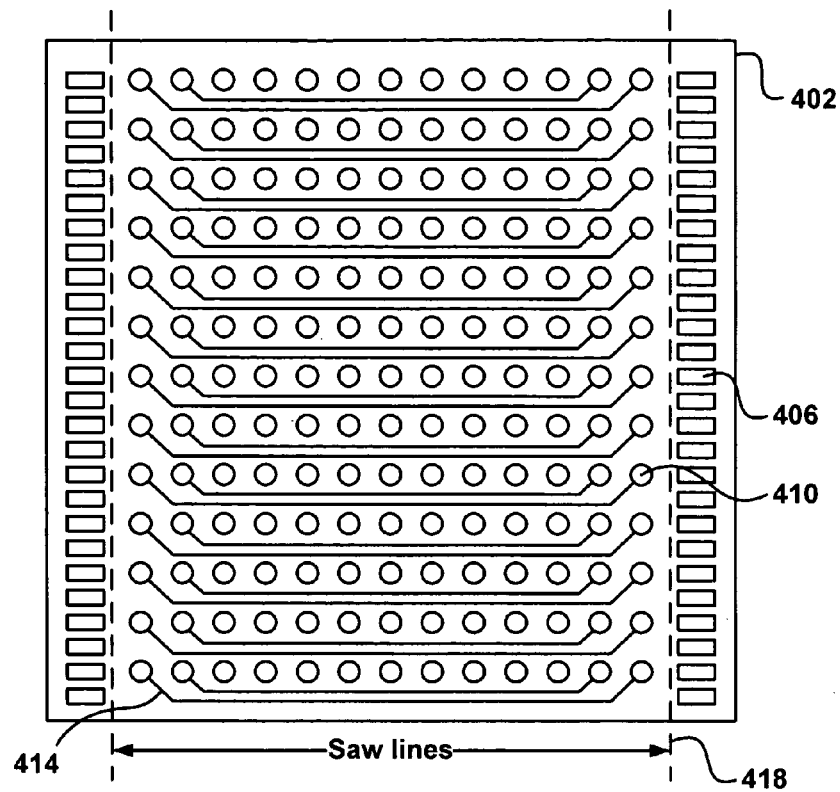
FIG. 4 is a top view of a first and second integrated circuit, according to another embodiment.
Figure 4B:
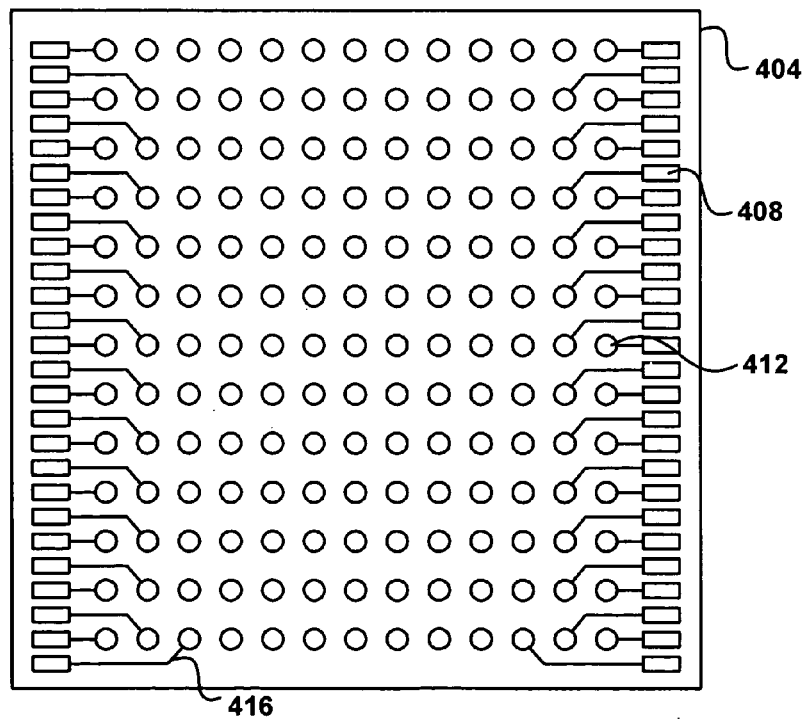

FIG. 4A depicts a top view of a first integrated circuit 402 and FIG. 4B depicts a top view of a second integrated circuit 404. The first and second integrated circuits 402, 404 may have a front surface and a back surface. The front surface may be an "active" surface in which electrical connections may be made. The back surface may be an "inactive" surface in which connections might not be made. FIG. 4A and FIG. 4B depict the active surfaces of the integrated circuits 402, 404.

The first and second integrated circuits 402, 404 may be rectangular in shape. Alternatively, the first and second integrated circuits 402, 404 may be square in shape. Preferably, the first and second integrated circuits 402, 404 are approximately the same size. However, the first and second integrated circuits 402, 404 may vary in size. In a preferred embodiment, the first and second integrated circuits 402, 404 may be thinned to a thickness of approximately 200-380 microns prior to sawing them into individual die. However, the first and second integrated circuits 402, 404 may be thinned more than preferred embodiment. For example, the first and second integrated circuits 402, 404 may be thinned to 100 microns. Alternatively, the first and second integrated circuits 402, 404 might not be thinned. When not thinned, the first and second integrated circuits 402, 404 may have a thickness of 725 microns for an eight inch wafer or a thickness of 675 microns for a six inch wafer. However, other wafer thicknesses may be used.

The first and second integrated circuits 402, 404 have a plurality of wire bond pads 406, 408 on the periphery of two opposing sides of the active surface. Alternatively, the first and second integrated circuits 402, 404 may have a plurality of wire bond pads 406, 408 on the periphery of all four sides of the active surface. The wire bond pads 406, 408 may be used to provide connectivity when using wire bonding technology. While twenty-six wire bond pads 406, 408 are shown on each of the two opposing sides of the integrated circuits 402, 404, more or less than twenty-six wire bond pads 406, 408 may be used. As further described with reference to FIG. 7, the wire bond pads 408 on the second integrated circuit 404 may be used for wire bonding.

The first and second integrated circuits 402, 404 also have a plurality of solderable chip pads 410, 412 located in the interior of the integrated circuits 402, 404. The solderable chip pads 410, 412 may be used to provide connectivity when using flip chip technology. While FIG. 4 depicts one hundred and sixty-nine solderable chip pads 410, 412 in the interiors of the first and second integrated circuits 402, 404, more or less than one hundred and sixty-nine solderable chip pads 410, 412 may be used. However in a preferred embodiment, the first and second integrated circuits 402, 404 each have the same number of solderable chip pads 410, 412.

The wire bond pads 406 on the first integrated circuit 402 may be removed at saw lines 418. The wire bond pads 406 may be removed from the first integrated circuit 402 by sawing or by any other compatible removal method. The removing of the wire bond pads 406 may result in the first integrated circuit 402 being more narrow than the second integrated circuit 404. Accordingly, when the first integrated circuit 402 is flipped and connected to the second integrated circuit 404, the wire bond pads 408 on the second integrated circuit 404 may extend past the edge of the first integrated circuit 402.

The solderable chip pads 410 in the interior of the first integrated circuit 402 may contain under bump metallization with solder bumps. A metal redistribution layer 414 may be deposited on the active surface of the first integrated circuit 402 to provide an interconnect layer. An example metal redistribution layer 414 is shown in FIG. 4A. However, it is understood that a variety of redistribution layer designs may be used. An automatic router is typically used to design the redistribution layer 414.

The metal redistribution layer 414 may connect various solderable chip pads 410 to metal pads on the first integrated circuit 402 so that power, ground, and I/O signals are supplied to required locations on the first integrated circuit 402 (e.g., power is supplied to the power bus on the first integrated circuit 402, ground is supplied to the ground bus on the first integrated circuit 402, and I/O is supplied to I/O circuits on the first integrated circuit 402). Further, the metal redistribution layer 414 may connect the solderable chip pads 410 on the first integrated circuit 402 to the wire bond pads 408 on the second integrated circuit 404 via the solderable chip pads 412 and a metal redistribution layer 416 on the second integrated circuit 404.

The solderable chip pads 412 in the interior of the second integrated circuit 404 may contain under bump metallization. The second integrated circuit 404 may be designed so that power, ground, and I/O are supplied through wire bond pads 408 on the perimeter of the second integrated circuit 404. Additionally or alternatively, the second integrated circuit 404 may be designed so that power, ground, and I/O for the first integrated circuit 402 are supplied to the solderable chip pads 412 in the interior of the second integrated circuit 404 that are connected to the wire bond pads 408 using the metal redistribution layer 416.

As described above, a metal redistribution layer may be located on the active surface of both the first and second integrated circuits 402, 404. The metal redistribution layers 414, 416 may provide interconnections within the first and second integrated circuits 402, 404 and between the first and second integrated circuits 402, 404. The interconnections may connect the wire bond pads 408 to appropriate interior solderable chip pads 410, 412. As a result of the interconnections, the signals needed on the first integrated circuit 402 may be supplied through the wire bond pads 408 on the second integrated circuit 404 when the first and second integrated circuits 402, 404 are connected together. Typically, the first and second integrated circuits 402, 404 have different redistribution patterns.

Figure 5:
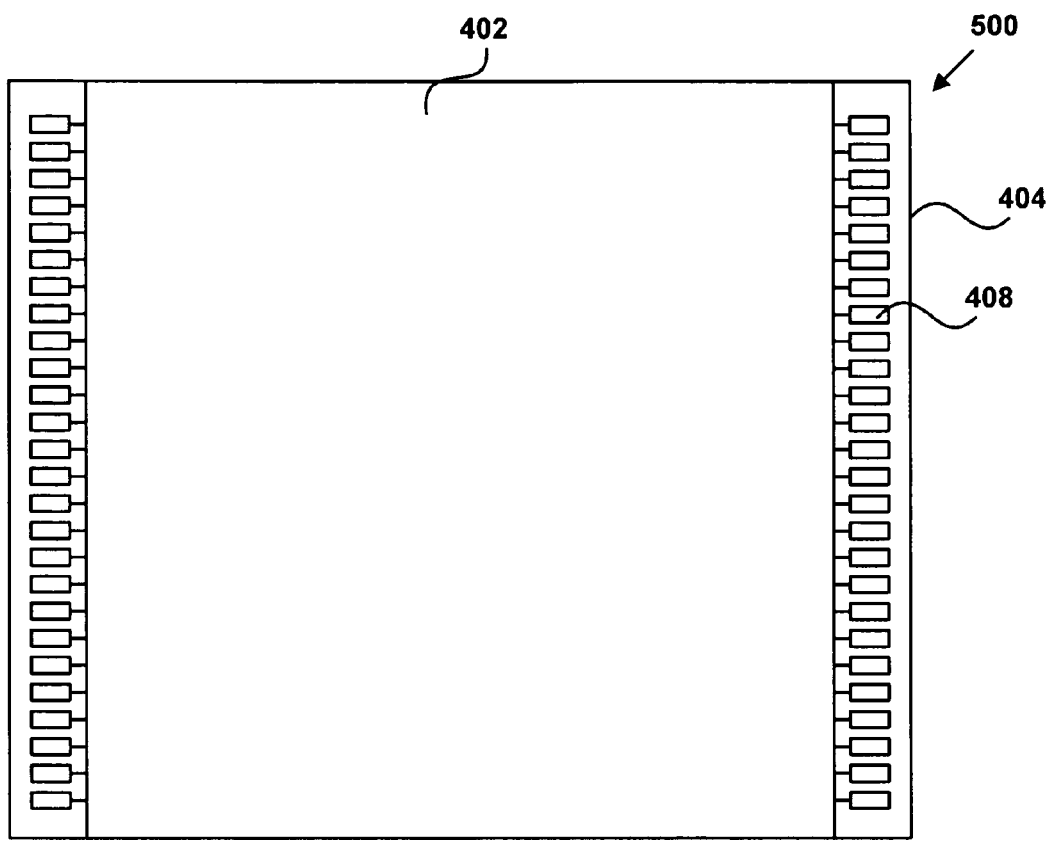
FIG. 5 is a top view of an integrated circuit pair formed by the first and second integrated circuits depicted in FIG. 4, according to an embodiment.

FIG. 5 depicts a top view of an integrated circuit pair 500 formed by the first and second integrated circuits 402, 404 depicted in FIG. 4. The integrated circuit pair 500 may be assembled by flipping the first integrated circuit 402 and connecting the active surface of the first integrated circuit 402 to the active surface of the second integrated circuit 404 using flip chip bonding. Because the first integrated circuit 402 is flipped, the inactive surface of the first integrated circuit 402 is shown in FIG. 5. While an underfill may be used between the two integrated circuits 402, 404, the underfill may not be necessary if the two integrated circuits 402, 404 have substantially equal thermal expansion coefficients and the underfill is not required for environmental protection.

Because the first integrated circuit 402 is narrower than the second integrated circuit 404 due to the removal of the wire bond pads 406 on the first integrated circuit 402, the wire bond pads 408 on the second integrated circuit 404 may extend past the edge of the first integrated circuit 402. As a result, the wire bond pads 408 on the second integrated circuit 404 may be easily accessible for wire bonding.

Figure 6:
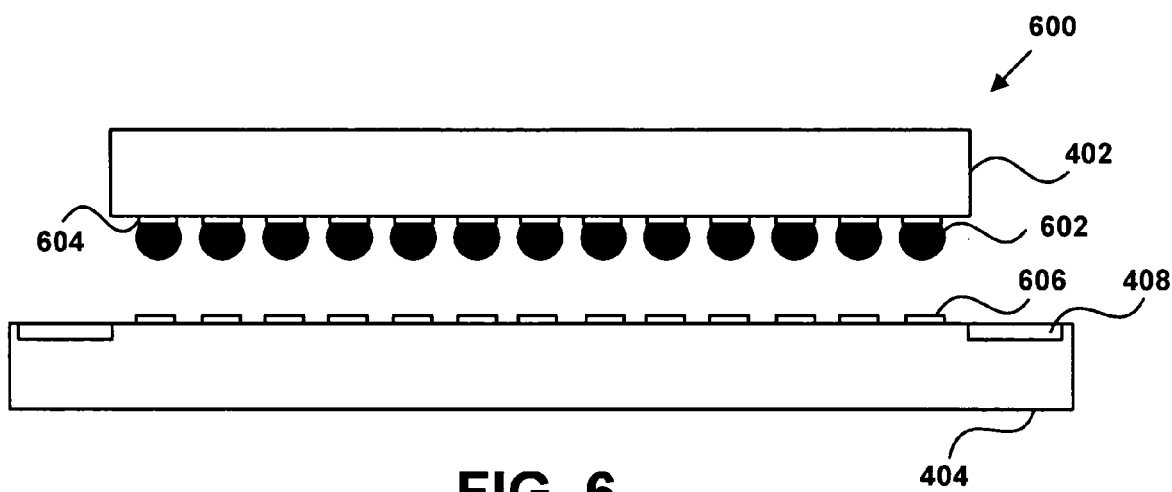
FIG. 6 is a side view of the integrated circuit pair depicted in FIG. 5, according to an embodiment.

FIG. 6 depicts a side view 600 of the integrated circuit pair 500 depicted in FIG. 5 prior to connection. The side view 600 depicts the first integrated circuit 402 flipped and positioned over the second integrated circuit 404. Solder bumps 602 are located on under bump metallization 604 located on the first integrated circuit 402. The solder bumps 602 extend from the first integrated circuit 402 towards the under bump metallization 606 located on the second integrated circuit 404. When the flip chip bonding is completed, the solder bumps 602 may connect to the under bump metallization 606 on the second integrated circuit 404.

The side view 600 also depicts the wire bond pads 408 on the second integrated circuit 404 extending past the edge of the first integrated circuit 402. As a result, the wire bond pads 408 on the second integrated circuit 404 may be easily accessible for wire bonding purposes.

Once the integrated circuit pair 500 is formed, the integrated circuit pair 500 may be stacked with other integrated circuit pairs. Once stacked, wire bonding may be performed. Details regarding forming an integrated circuit stack are provided with reference to FIG. 7. While two embodiments for forming an integrated circuit pair have been described, other methods and variations may also be used.

III. Forming an Integrated Circuit Stack

Figure 7:
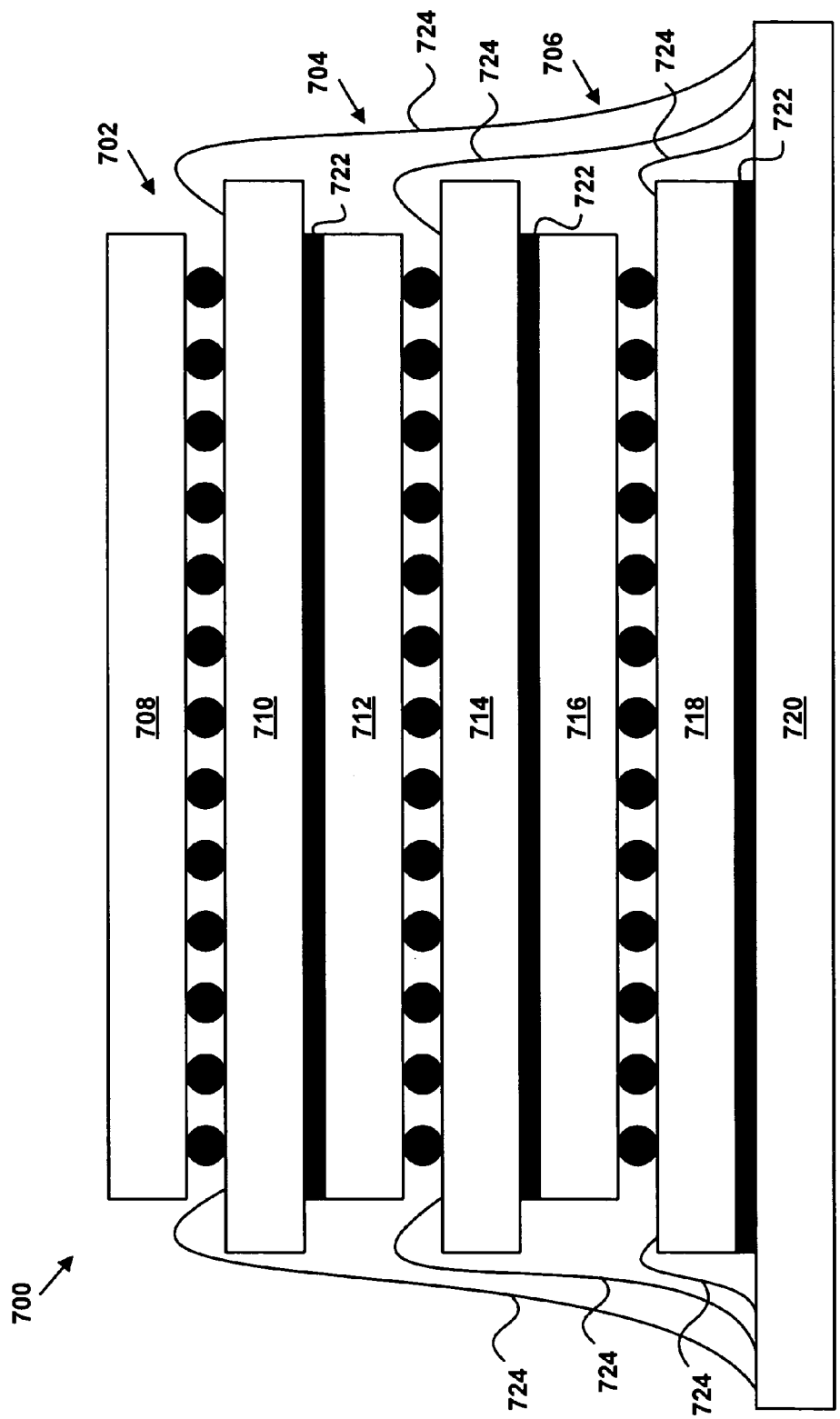
FIG. 7 is a side view of stacked integrated circuit pairs, according to an embodiment.

FIG. 7 depicts a side view of a stack 700 of integrated circuit pairs. FIG. 7 depicts three integrated circuit pairs 702-706. However, there may be more or less than three integrated circuit pairs in the stack 700. The first integrated circuit pair 702 may include a first integrated circuit 708 that is connected to a second integrated circuit 710 using flip chip bonding. The second integrated circuit pair 704 may include a first integrated circuit 712 that is connected to a second integrated circuit 714 using flip chip bonding. The third integrated circuit pair 706 may include a first integrated circuit 716 that is connected to a second integrated circuit 718 using flip chip bonding. The three integrated circuit pairs 702-706 may be formed by using any combination of the methods described with reference to FIGS. 1-6.

The third integrated circuit pair 706 may be attached to a substrate 720 by using a standard die attach material 722, such as an epoxy adhesive. Alternatively, the third integrated circuit pair 706 may be attached to a printed circuit board or a package. The inactive surface of. the second integrated circuit 718 in the third integrated circuit pair 706 may be bonded to the substrate 720 with the adhesive 722. Bonding wire 724 may be used to connect the substrate 720 to wire bond pads on the second integrated circuit 718 in the third stacked pair 706. The bonding wire may be aluminum, gold, or any other appropriate wire bonding material.

The second integrated circuit pair 704 may be attached to the third integrated circuit pair 706 using the standard die attach material 722. The inactive surface of the second integrated circuit 714 in the second integrated circuit pair 704 may be bonded to the inactive surface of the first integrated circuit 716 in the third integrated circuit pair 706 with the adhesive 722. The bonding wire 724 may be used to connect the substrate 720 to wire bond pads on the second integrated circuit 714 in the second integrated circuit pair 704.

The process of attaching and wire bonding integrated circuit pairs may be repeated as many times as desired. For the stack 700 depicted in FIG. 7, this process may be continued one additional time as follows. The first integrated circuit pair 702 may be attached to the second integrated circuit pair 704 using the standard die attach material 722. The inactive surface of the second integrated circuit 710 in the first integrated circuit pair 702 may be bonded to the inactive surface of the first integrated circuit 712 in the second integrated circuit pair 704 with the adhesive 722. The bonding wire 724 may be used to connect the substrate 720 to wire bond pads on the second integrated circuit 710 in the first integrated circuit pair 702.

As seen in FIG. 7, the first integrated circuit 716 in the third integrated circuit pair 706 may provide spacing between the second integrated circuit 714 in the second integrated circuit pair 704 and the second integrated circuit 718 in the third integrated circuit pair 706. Likewise, the first integrated circuit 712 in the second integrated circuit pair 704 may provide spacing between the second integrated circuit 710 in the first integrated circuit pair 702 and the second integrated circuit 714 in the second integrated circuit pair 704. This spacing may provide clearance for the wire bonds 724 to reach the substrate 720 without obstruction.

This stacking approach may achieve efficient heat removal from the integrated circuits by, providing a conduction pathway through the large-cross section of the integrated circuits and the integrated circuit connections to the substrate 720. This heat conduction path may be enhanced by using a thin thermally conductive epoxy bond between the stacked integrated circuits and by using a full array of solder connections in the flip chip interfaces.

Beneficially, the design of the integrated circuits in the stack 700 may be independent of the position of the integrated circuit in the stack 700 (i.e., bottom, middle, top). If fact, each integrated circuit in the stack 700 may have the same circuit design. This method of stacking integrated circuits is particularly well-suited for stacking memory circuits. In memory circuit applications, the integrated circuits in the stack may share data and address signals, with only a minimal number of unique connections for each individual integrated circuit in the stack.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A stacked integrated circuit comprising:
   a substrate;
   a first integrated circuit pair including a first integrated circuit and a second integrated circuit, wherein an active surface of the first integrated circuit is attached to an active surface of the second integrated circuit using flip chip bonding, wherein the first integrated circuit pair is stacked on the substrate, and wherein a first wire bond pad on the second integrated circuit is connected to the substrate using wire bonding;
   wherein the first and second integrated circuits are substantially the same size; and
   wherein the first and second integrated circuits are memory circuits having the same circuit design, and wherein the first and second integrated circuits share data and address signals.

2. The stacked integrated circuit of claim 1, further comprising a second integrated circuit pair including a third integrated circuit and a fourth integrated circuit, wherein an active surface of the third integrated circuit is attached to an active surface of the fourth integrated circuit using flip chip bonding wherein the second integrated circuit pair is stacked on the first integrated circuit pair, wherein a second wire bond pad on the fourth integrated circuit is connected to the substrate using wire bonding; and wherein the third and fourth integrated circuits are substantially the same size.

3. The stacked integrated circuit of claim 2, wherein a second solder bump electrically connects a third solder chip pad on the third integrated circuit to a fourth solder chip pad on the fourth integrated circuit.

4. The stacked integrated circuit of claim 2, wherein the third and fourth integrated circuits are memory circuits having the same circuit design, and wherein the third and fourth integrated circuits share data and address signals.

5. The stacked integrated circuit of claim 2, further comprising a third redistribution layer located on the active surface of the third integrated circuit and a fourth redistribution layer located on the active surface of the fourth integrated circuit, wherein the third and fourth redistribution layers allow signals needed on the third integrated circuit to be supplied through wire bond pads on the fourth integrated circuit.

6. The stacked integrated circuit of claim 2, wherein the second integrated circuit pair is joined to the first integrated circuit pair with a thermally conductive epoxy bond that forms a heat conduction path between the first and second integrated circuit pairs.

7. The stacked integrated circuit of claim 1, wherein a first solder bump electrically connects a first solder chip pad on the first integrated circuit to a second solder chip pad on the second integrated circuit.

8. The stacked integrated circuit of claim 1, further comprising a first redistribution layer located on the active surface of the first integrated circuit and a second redistribution layer located on the active surface of the second integrated circuit, wherein the first and second redistribution layers allow signals needed on the first integrated circuit to be supplied through wire bond pads on the second integrated circuit.

9. The stacked integrated circuit of claim 1, wherein the first integrated circuit pair is joined to the substrate with a thermally conductive epoxy bond that forms a heat conduction path from the first integrated circuit pair to the substrate.

10. A stacked integrated circuit comprising:

a substrate;

a first integrated circuit pair including a first integrated circuit and a second integrated circuit, wherein an active surface of the first integrated circuit is attached to an active surface of the second integrated circuit using flip chip bonding, wherein the first integrated circuit pair is stacked on the substrate, and wherein the second integrated circuit is connected to the substrate using wire bonding;

a second integrated circuit pair including a third integrated circuit and a fourth integrated circuit, wherein an active surface of the third integrated circuit is attached to an active surface of the fourth integrated circuit using flip chip bonding, wherein the second integrated circuit pair is stacked on the first integrated circuit pair, wherein the fourth integrated circuit is connected to the substrate using wire bonding, wherein the first, second, third, and fourth integrated circuits are substantially the same size; and wherein the first, second, third, and fourth integrated circuits are memory circuits having the same circuit design, and wherein the first, second, third, and fourth integrated circuits share data and address signals.

11. The stacked integrated circuit of claim 10, wherein a first solder bump electrically connects a first solder chip pad on the first integrated circuit to a second solder chip pad on the second integrated circuit, and wherein a second solder bump electrically connects a third solder chip pad on the third integrated circuit to a fourth solder chip pad on the fourth integrated circuit.

12. The stacked integrated circuit of claim 10, wherein the second integrated circuit pair is joined to the first integrated circuit pair with a thermally conductive epoxy bond that forms a heat conduction path between the first and second integrated circuit pairs.

13. A stacked integrated circuit comprising:

a substrate;

a first integrated circuit pair including a first integrated circuit and a second integrated circuit, wherein an active surface of the first integrated circuit is attached to an active surface of the second integrated circuit using flip chip bonding such that a first solder bump electrically connects a first solder chip pad on the first integrated circuit to a second solder chip pad on the second integrated circuit, wherein the first integrated circuit pair is stacked on the substrate, and wherein the second integrated circuit is connected to the substrate using wire bonding;

a second integrated circuit pair including a third integrated circuit and a fourth integrated circuit, wherein the active surface of the third integrated circuit is attached to the active surface of the fourth integrated circuit using flip chip bonding such that a second solder bump electrically connects a third solder chip pad on the third integrated circuit to a fourth solder chip pad on the fourth integrated circuit, wherein the second integrated circuit pair is stacked on the first integrated circuit pair, wherein the fourth integrated circuit is connected to the substrate using wire bonding, and wherein the first, second, third, and fourth integrated circuits are substantially the same size;

a first adhesive layer located between an inactive surface of the second integrated circuit and the substrate;

a second adhesive layer located between an inactive surface of the first integrated circuit and an inactive surface of the fourth integrated circuit; and wherein the first, second, third, and fourth integrated circuits are memory circuits having the same circuit design, and wherein the first, second, third, and fourth integrated circuits share data and address signals.

14. The stacked integrated circuit of claim 13, wherein the first, second, third, and fourth integrated circuits are rectangular.

15. The stacked integrated circuit of claim 13, further comprising a first redistribution layer located on the active surface of the first integrated circuit and a second redistribution layer located on the active surface of the second integrated circuit, wherein the first and second redistribution layers allow signals needed on the first integrated circuit to be supplied through wire bond pads on the second integrated circuit.

16. The stacked integrated circuit of claim 13, further comprising a third redistribution layer located on the active surface of the third integrated circuit and a fourth redistribution layer located on the active surface of the fourth integrated circuit, wherein the third and fourth redistribution layers allow signals needed on the third integrated circuit to be supplied through wire bond pads on the fourth integrated circuit.

17. The stacked integrated circuit of claim 13, wherein the first adhesive layer comprises a thermally conductive epoxy bond that forms a heat conduction path between the first integrated circuit pair and the substrate, and wherein the second adhesive layer comprises a thermally conductive epoxy bond that forms a heat conduction path between the first and second integrated circuit pairs.

* * * * *